(12) United States Patent (10) Patent No.: US 7,087,512 B2
Hedler et al. (45) Date of Patent: Aug. 8, 2006

(54) METHOD FOR FABRICATING CONNECTION REGIONS OF AN INTEGRATED CIRCUIT, AND INTEGRATED CIRCUIT HAVING CONNECTION REGIONS

(75) Inventors: Harry Hedler, Germering (DE); Roland Irsigler, Munich (DE); Thorsten Meyer, Dresden (DE); Barbara Vasquez, Orinda, CA (US)

(73) Assignee: Infineon Technologies AG, Munich (DE)

( * ) Notice: Subject to any disclaimer, the term of this patent is extended or adjusted under 35 U.S.C. 154(b) by 81 days.

(21) Appl. No.: 10/642,092

(22) Filed: Aug. 15, 2003

(65) Prior Publication Data

US 2005/0250304 A1 Nov. 10, 2005

(30) Foreign Application Priority Data

Aug. 23, 2002 (DE) ................... 102 38 816

(51) Int. Cl.
*H01L 21/44* (2006.01)
(52) U.S. Cl. ..................... 438/612; 438/613
(58) Field of Classification Search ............... 438/597, 438/397, 758, 612, 613; 257/1
See application file for complete search history.

(56) References Cited

U.S. PATENT DOCUMENTS

| | | | |
|---|---|---|---|
| 4,372,809 A | 2/1983 | Grewal et al. | |
| 5,010,389 A | 4/1991 | Gansauge et al. | |
| 5,449,955 A | 9/1995 | Debiec et al. | |
| 5,989,945 A * | 11/1999 | Yudasaka et al. | 438/149 |
| 6,130,141 A * | 10/2000 | Degani et al. | 438/455 |
| 6,251,702 B1* | 6/2001 | Wensel | 438/106 |
| 6,423,570 B1* | 7/2002 | Ma et al. | 438/106 |
| 6,465,282 B1* | 10/2002 | Tobben et al. | 438/131 |
| 6,524,346 B1* | 2/2003 | Farnworth | 438/763 |
| 6,597,069 B1* | 7/2003 | Degani et al. | 257/778 |

FOREIGN PATENT DOCUMENTS

| | | |
|---|---|---|
| DE | 3107943 | 9/1982 |
| DE | 3824008 | 1/1990 |
| DE | 68927931 T | 9/1997 |
| DE | 69500388 T | 10/1997 |
| DE | 19712219 | 10/1998 |

* cited by examiner

*Primary Examiner*—Alexander Ghyka
(74) *Attorney, Agent, or Firm*—Fish & Richardson P.C.

(57) ABSTRACT

A method for fabricating an integrated circuit connection region includes application of a dielectric to an integrated circuit with a connection region, application of a corrodible metalization layer to the dielectric, application of a protection device to the metalization layer, and removal of the protection device in a region around the connection region.

10 Claims, 5 Drawing Sheets

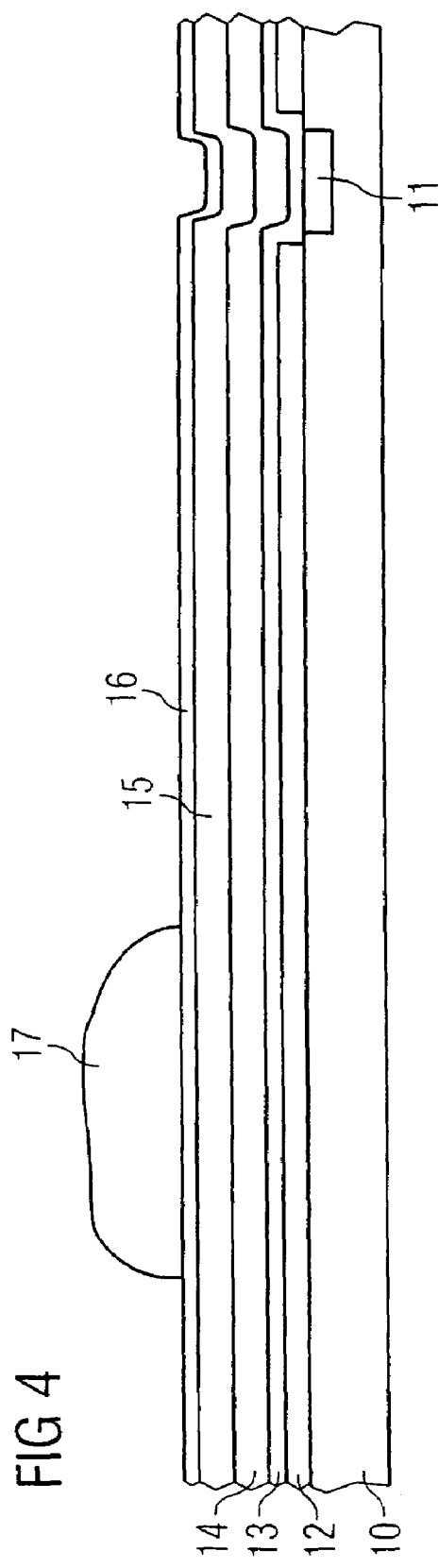
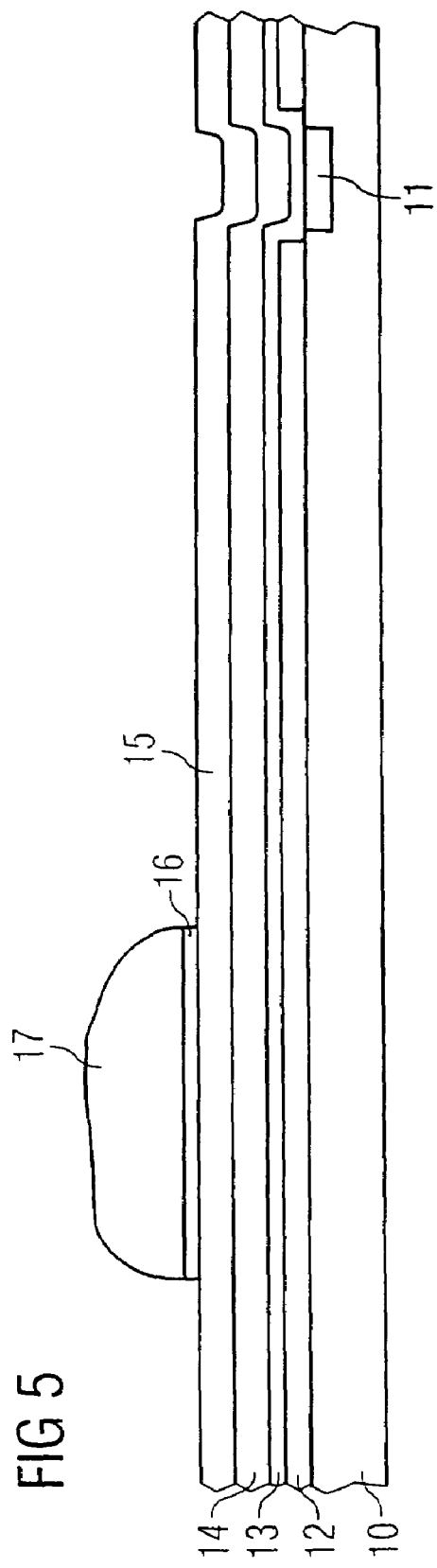
FIG 4
FIG 5

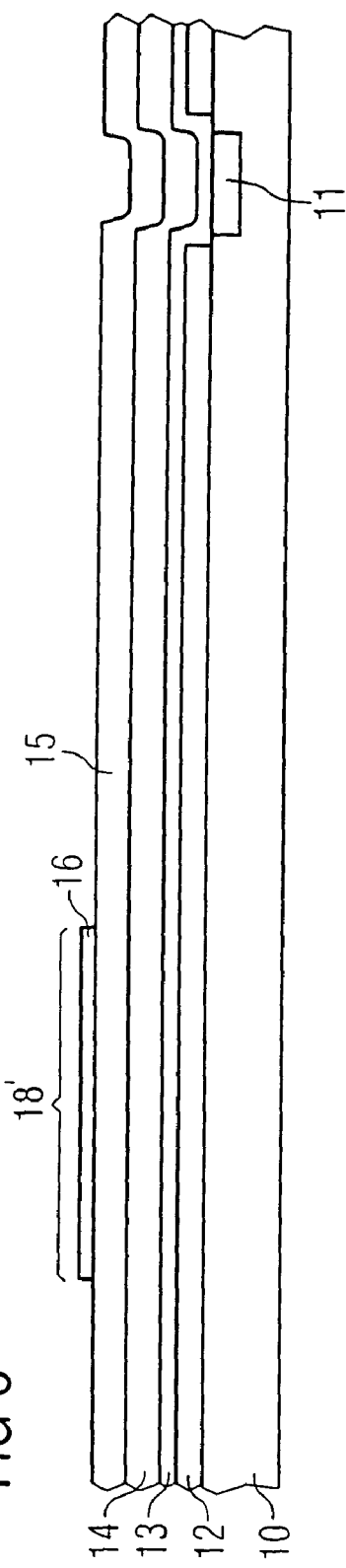
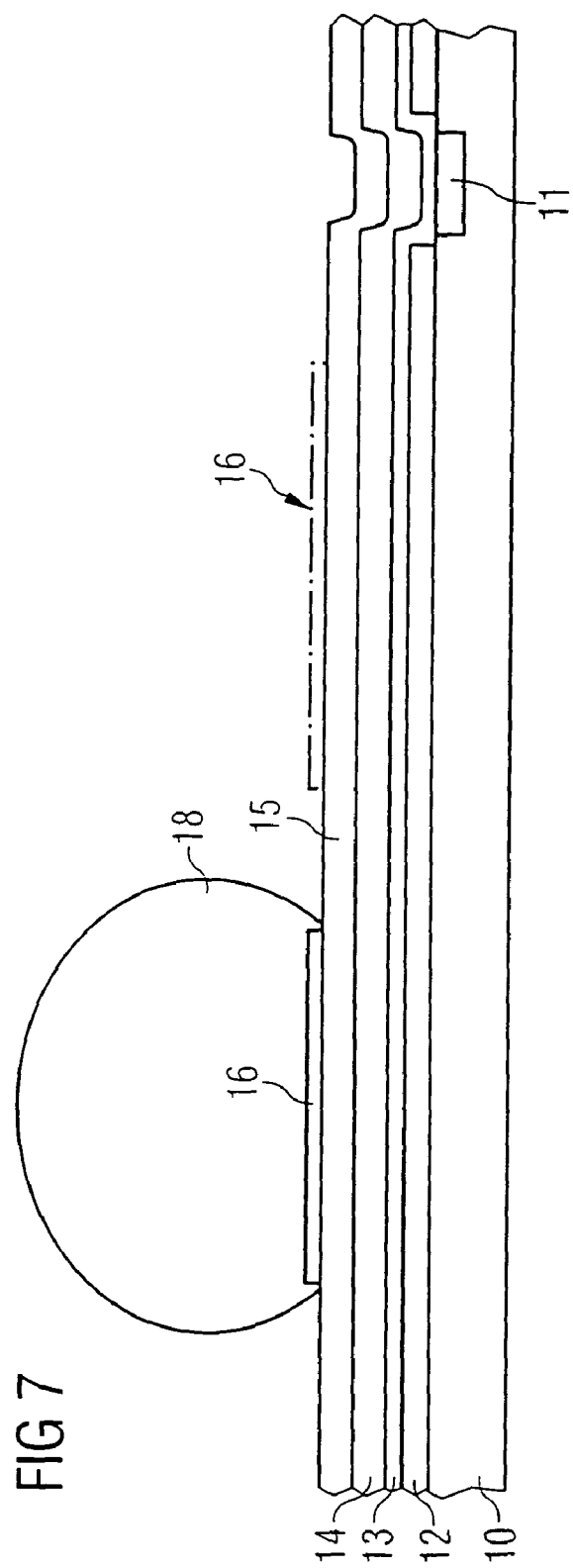

METHOD FOR FABRICATING CONNECTION REGIONS OF AN INTEGRATED CIRCUIT, AND INTEGRATED CIRCUIT HAVING CONNECTION REGIONS

RELATED APPLICATIONS

This application claims priority from German Application Serial No. 102 38 816.4, filed Aug. 23, 2002, the contents of which are incorporated herein by reference.

AREA OF INVENTION

The present invention relates to a method for fabricating connection regions of an integrated circuit and to an integrated circuit having connection regions.

BACKGROUND

Semiconductor devices or integrated circuits which are provided in a flip-chip structure have solder balls for making vertical contact between the integrated circuit and a printed circuit board or a further integrated circuit in a stack. The solder ball is arranged on a connection device or a pad, e.g. on a chip, which is connected to the active section of the chip by metal lines or interconnects which form a rewiring device. The connection device or pad and the layers are often fabricated from a stack of plated metals, such as copper, nickel and a gold covering layer.

All solder ball arrangements or packages require a type of solder stop around the ball. This is required since the solder has a tendency to wet not just the soldering pad itself but also the adjoining rewiring device. Without solder stop structures, the solder would flow away during the solder reliquification or reflow. It is customary for a solder stop resist or resin to be applied to the rewiring, preventing the solder from flowing away.

If the rewiring layout is two-dimensional, the resist is normally applied, in particular spun on, and then patterned by means of a photographic technique. Alternatively, the solder stop material can be applied in a printing process if the feature sizes are large enough. In the case of three-dimensional structures, application is much more difficult. The adhesion or bonding of these organic layers to gold is not very good, which may result in the solder running under the resist and wetting covered sections of the metal lines or interconnects. Furthermore, resists which can be exposed by photographic techniques and have the required temperature stability are expensive.

SUMMARY

Therefore, it is an object of the present invention to provide a method for fabricating connection regions of an integrated circuit and an integrated circuit having connection regions which prevent solder from wetting the entire rewiring device without having to use a soldering stop resist.

The idea on which the present invention is based consists in removing the readily wettable covering layer or protection device, which preferably includes gold, around a connection region, i.e. around a connection pad, on which a solder ball is provided.

In the present invention, the problem mentioned in the introduction is solved in particular through the fact that the oxidizable or corrodible metallization located beneath the protection device is uncovered and passivated, i.e. oxidized, in a region around the connection region and can therefore act as a soldering stop.

According to a preferred refinement, a connection device, preferably a solder ball, is applied to predetermined connection regions.

According to a further preferred refinement, a carrier layer is applied to a dielectric, preferably by sputtering.

According to a further preferred refinement, the oxidizable metallization has an interconnect level and/or a barrier device, which are preferably deposited electrochemically.

According to a further preferred refinement, to produce the patterned protection device the metallization is provided with a patterned photomask before the protection device is applied.

According to a further preferred refinement, the protection device is deposited electrochemically or by metal deposition without external current.

According to a further preferred refinement, the protection device is patterned in an etching step, preferably a wet-etching step, by means of a photomask which has been patterned in a photochemical process.

According to a further preferred refinement, the carrier layer and/or the interconnect level includes Cu.

According to a further preferred refinement, the metallization includes a metal or metal oxide, preferably based on Ni, which cannot be wetted with solder.

According to a further preferred refinement, the protection device consists of a corrosion-resistant metal, in particular Au.

According to a further preferred refinement, the metallization is oxidized and not wetted with solder in the region around the connection region, which has been uncovered by the protection device.

BRIEF DESCRIPTION OF DRAWINGS

FIGS. 3 to 7 show a cross section through an integrated circuit after in each case further method steps for the purpose of explaining a first embodiment of the present invention;

DETAILED DESCRIPTION

Figure 1:
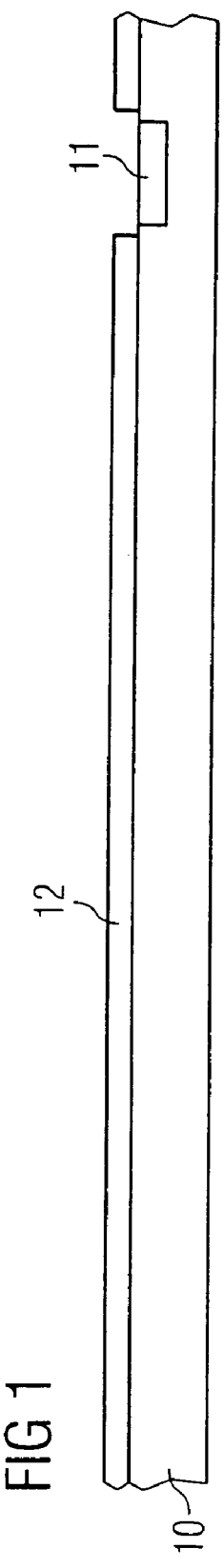
FIG. 1 shows a cross section through an integrated circuit after a first method step for the purpose of explaining an embodiment of the present invention.

FIG. 1 shows a cross section through an integrated circuit or semiconductor device after a method step for the purpose of explaining an embodiment of the present invention.

FIG. 1 illustrates an integrated circuit 10 or a semiconductor substrate which has been provided with a contact device 11. The contact device 11 is used to make electrical contact with an active semiconductor region, e.g. with a rewiring device. A dielectric 12 or a passivation, which has a cutout above the contact device 11, is applied to the integrated circuit 10. The integrated circuit may be in the form of a wafer or may already be in the form of a semiconductor chip.

Figure 2:
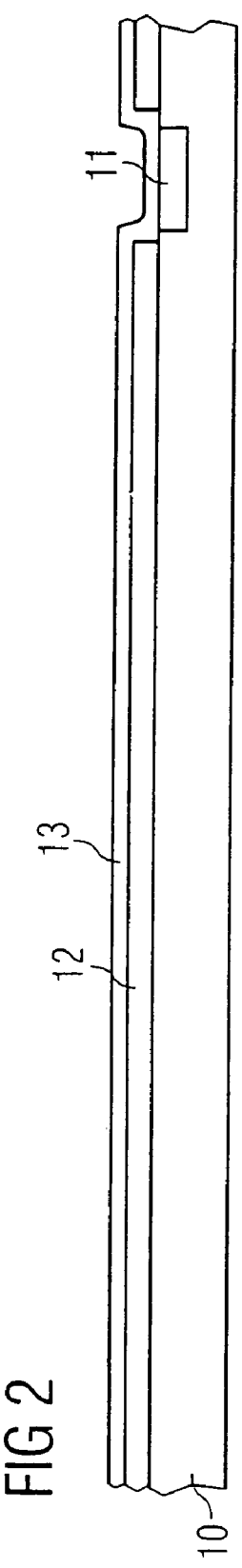
FIG. 2 shows a cross section through an integrated circuit after a further method step for the purpose of explaining an embodiment of the present invention.

FIG. 2 shows a cross section through an integrated circuit after a further method step for the purpose of explaining an embodiment of the present invention.

A carrier layer 13 or seed layer has been applied to the entire surface of the integrated circuit 10 and covers both the dielectric 12 and the contact device 11. The carrier layer 13 is preferably applied by sputtering and includes, for example, Ti, Al or Cu. As illustrated in FIG. 2, an offset or a well-like structure is formed above the contact device 11 on account of the metallization 13 having been substantially homogenously sputtered onto the dielectric layer 12 provided with the recess above the contact device 11.

Figure 3:
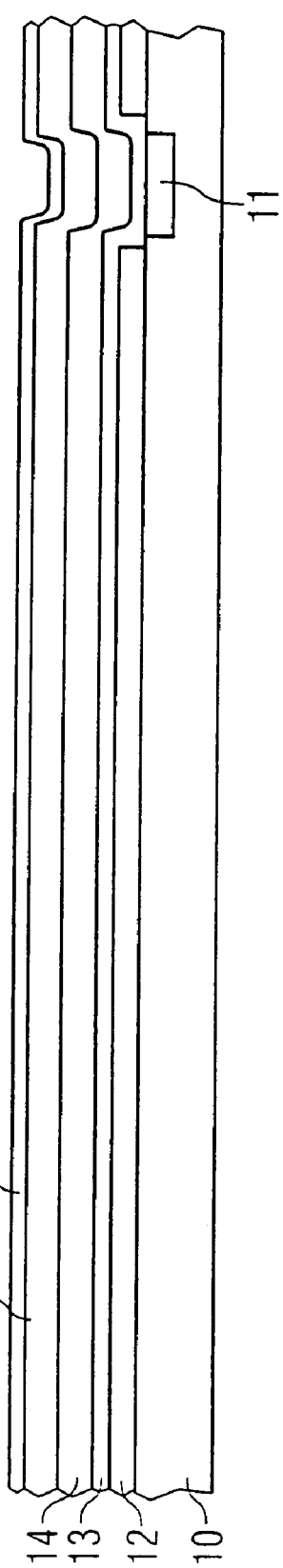

FIG. 3 shows a cross section through an integrated circuit after a number of subsequent process steps for explaining a first embodiment of the present invention.

FIG. 3 illustrates the integrated circuit shown in FIG. 2, except that an interconnect level 14, which preferably includes Al or Cu and is in particular plated on, i.e. applied electrochemically, adjoining a further metallization 15, which has preferably been applied electrochemically and forms a barrier layer 15, is provided above the carrier layer 13. The barrier layer 15 preferably includes an oxidizable metal, such as for example Ni.

To protect the barrier layer 15 from corrosion, a protection device 16 is applied above the barrier layer 15, i.e. is preferably electroplated or deposited without the use of external current. This protection device 16 comprises a corrosion-resistant metal which is preferably readily wetted by solder and by way of example includes Au. The interconnect level 14 is the primary electrical conductor in the layer sequence 13, 14, 15 and 16. The barrier layer 15 prevents the migration of atoms out of the interconnect level 14, which preferably consists of copper, into a connection device 16, 18, which subsequently, in order to make contact with the rewiring device 13, 14, 15 and 16, can be connected in the vertical direction preferably to a printed circuit board or a further integrated circuit (in each case not shown). The barrier layer 15, consisting in particular of Ni, is preferably an oxidizable metal which is not wetted by solder as soon as it has been oxidized. The protection device 16, preferably made from gold, is very thin, is easy for solder to wet and protects the barrier layer 15, preferably made from Ni, lying below it from oxidation or corrosion.

FIG. 4 shows a cross section through an integrated circuit after a further method step for the purpose of explaining a first embodiment of the present invention. In FIG. 4, a photochemically patterned photoresist mask 17, which in a subsequent etching step, in particular a wet-etching step, protects the protection device 16 from being etched away in the region covered by the photoresist structure, has been formed above the protection device 16.

FIG. 5 illustrates the arrangement shown in FIG. 4 after the removal of the protection device 16 in sections which are uncovered by the photoresist structure 17, preferably by means of a wet-etching step.

FIG. 6 shows a cross-section through the integrated circuit shown in FIG. 5 after the removal of the photoresist mask 17. At a predetermined location there is a connection region 18'. At least in a region around the connection region 18', the barrier layer 15 is uncovered and is thereby exposed to oxidation or corrosion.

FIG. 7 shows a cross section through an integrated circuit for the purpose of explaining the first embodiment of the present invention.

FIG. 7 illustrates the integrated circuit shown in FIG. 6, except that a solder ball, which is used to make vertical contact, for example with a printed circuit board or further integrated circuits, has been applied to the contact region 18', i.e. the patterned protection device 16. This ensures that electrical contact is made between the contact device 11 and the connection device 18, which preferably comprises a solder ball, via the rewiring device 13, 14, 15 and 16.

As indicated by dotted lines in FIG. 7, it is not necessary for the entire protection device 16 above the barrier device 15 to be removed, but at least a region around the connection region 18', which is wetted with solder, has to be taken out of the protection device 16, i.e. in this region around the connection device 18 it must be possible for the barrier layer 15 to be uncovered and oxidized. Since the passivated metal, preferably nickel, of the barrier layer 15 is not wetted by solder, it serves as a solder stop device.

Figure 8:
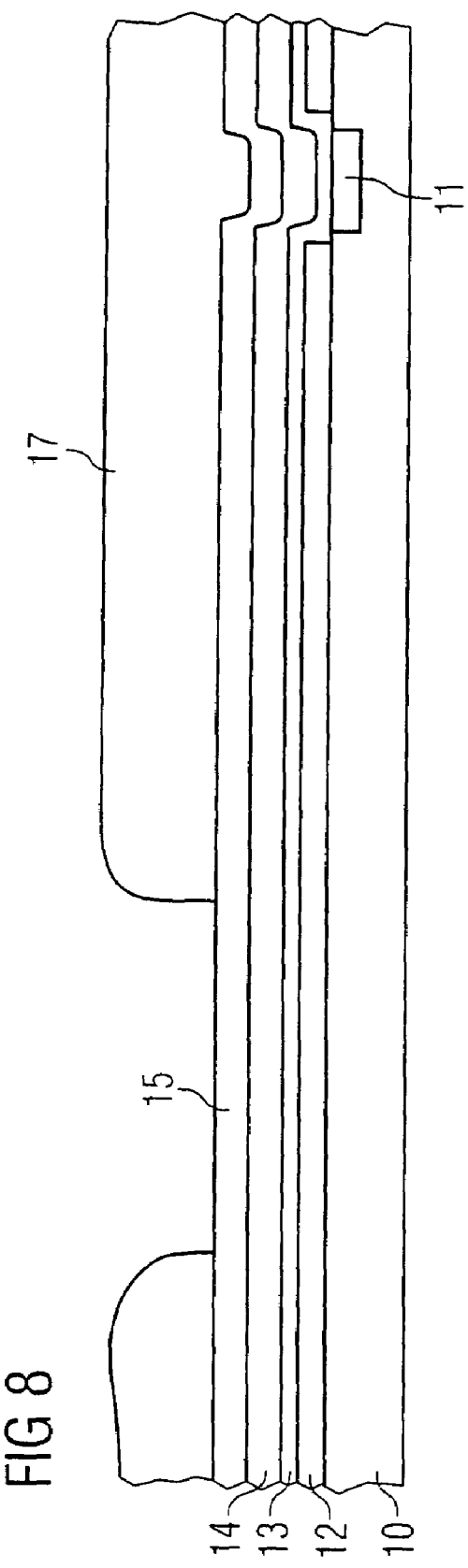
FIG. 8 shows a cross section through an integrated circuit corresponding to that shown in FIG. 3, but without a protection device having been applied, for the purpose of explaining a second embodiment of the present invention.

FIG. 8 shows a cross section through an integrated circuit as shown in FIG. 3, but without an applied protection device, for the purpose of explaining a second embodiment of the present invention.

In FIG. 8, a patterned photoresist structure 17 has been applied to the barrier layer 15, which preferably consists of an oxidizable metal, such as Ni. However, this photoresist structure 17 represents a negative structure compared to the photo resist structure shown in FIG. 4. In this case, the surfaces of the barrier device 15 which are covered by the photoresist structure 17 are to be protected from deposition during a subsequent application of a metallization 16, which is preferably carried out by means of electrochemical plating. In this case too, as described with reference to FIG. 4, the patterned photoresist structure 17 is achieved using known photolithographic means.

Figure 9:
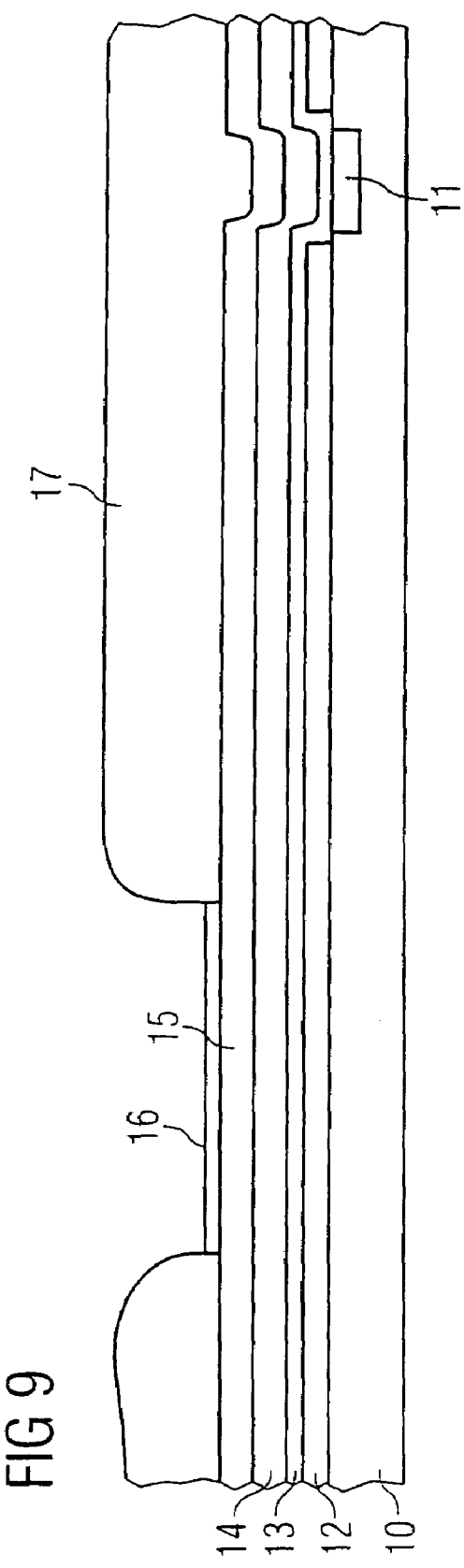
FIGS. 9 to 11 show a cross section through an integrated circuit after in each case successive method steps for the purpose of explaining the second embodiment of the present invention.

FIG. 9 shows the integrated circuit presented in FIG. 8 in cross section after the application of a protection device 16, which preferably consists of Au. The protection device 16, which in particular forms a protection against corrosion and includes a material which can easily be wetted by solder, is preferably deposited in an electrochemical plating process.

Figure 10:
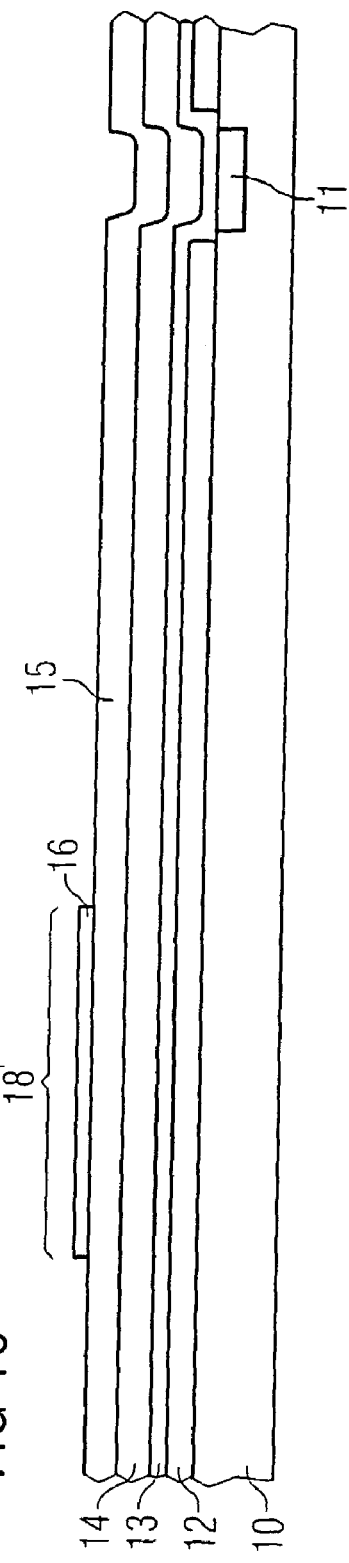

FIG. 10 shows the integrated circuit as shown in FIG. 9 in cross section after the removal of the photomask structure. Furthermore, the statements which have been made in connection with FIG. 6 also apply to FIG. 10.

Figure 11:
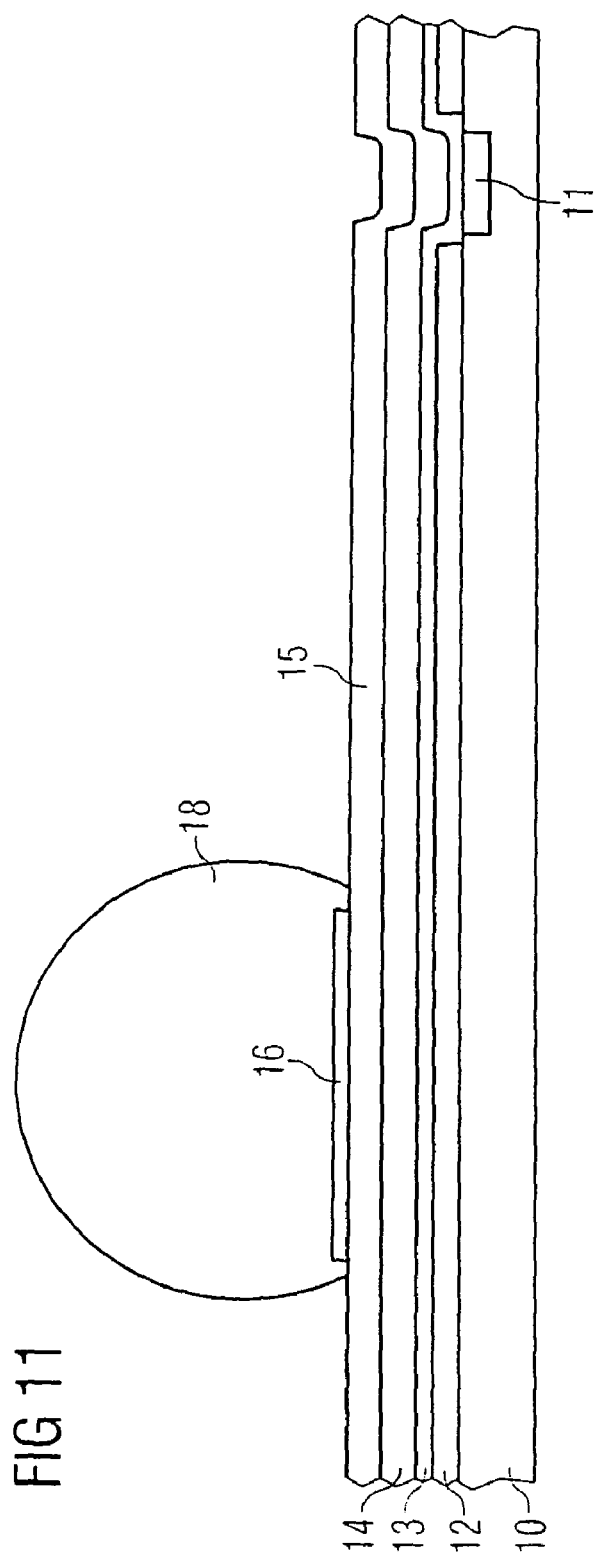

FIG. 11 shows a cross section through the integrated circuit with an applied contact device 18 on the readily wettable protection device 16, around which, at least in a region, the barrier layer 15 is uncovered and oxidized. Therefore, it is not wetted by solder, even if the solder ball 18 for making contact with a printed circuit board, a further semiconductor device or integrated circuit in the vertical direction, is liquefied again in order to make electrical contact with the corresponding other device. In additon, the statements which have been made in connection with FIG. 7 also apply.

According to the second embodiment, in which the readily wettable protection device 16 is applied to the barrier layer 15 only at the locations where there is no photoresist 17, it is possible to dispense with an expensive photographic step. In general, there are no adhesion problems with the present solder stop passivation, which means that solder cannot run under a stop resist, as is the case when using soldering stop resist, which ultimately results in cost savings.

Although the present invention has been described above on the basis of preferred exemplary embodiments, it is not restricted to these embodiments, but rather can be modified in numerous ways.

In particular, the choice of metal described (copper, nickel, gold, aluminum, titanium, etc.) and layer sequences is to be considered purely as an example; Ni, Cu, Al and Ti are to be understood as oxidizable metallizations, unlike Au.

What is claimed is:

1. A method comprising
providing an integrated circuit having a connection region,
applying a dielectric to the integrated circuit,
applying a metallization layer to the dielectric, the metallization layer being corrodible,
applying a conductive protection device that is wetable by the liquid solder to the metallization layer,
patterning the conductive protection device such that the protection device is removed an area around the connection region; and
oxidizing the metallization layer in the areas around the connection region thereby forming a solder stop device that is not wetable by the liquid solder.

2. The method of claim 1, further comprising
applying a connection device to the connection region.

3. The method of claim 2, wherein applying the connection device includes applying a solder ball.

4. The method of claim 1, further comprising
applying a carrier layer to the dielectric.

5. The method of claim 4, further comprising selecting a sputtering process for applying the carrier layer.

6. The method of claim 1, further comprising
applying an interconnect layer, and applying a barrier device to the dielectric.

7. The method of claim 6, wherein
applying the interconnect layer comprises electrochemically depositing the interconnect layer.

8. The method of claim 1, further comprising
patterning the metallization layer before applying the protection device.

9. The method of claim 1, further comprising
electrochemically depositing the protection device.

10. The method of claim 1, further comprising
providing a patterned photomask, and
etching the protection device in a region exposed by the photomask.

* * * * *